United States Patent [19]
Korenaga

[11] Patent Number: 6,107,703
[45] Date of Patent: Aug. 22, 2000

[54] LINEAR MOTOR MECHANISM FOR EXPOSURE APPARATUS, AND DEVICE MANUFACTURING METHOD USING THE SAME

[75] Inventor: Nobushige Korenaga, Utsunomiya, Japan

[73] Assignee: Canon Kabushiki Kaisha, Tokyo, Japan

[21] Appl. No.: 09/158,511

[22] Filed: Sep. 22, 1998

[30] Foreign Application Priority Data

Sep. 24, 1997 [JP] Japan ................................. 9-258531

[51] Int. Cl.⁷ .................................................. H02K 41/00
[52] U.S. Cl. .................................................. 310/12; 355/53
[58] Field of Search .................... 310/12, 13, 14; 33/1 M; 74/471 XY; 108/137, 138; 29/721, 760, 785; 318/568.17, 568.18, 568.19, 135, 574, 625, 649, 687; 355/53, 72

[56] References Cited

U.S. PATENT DOCUMENTS

| | | | |
|---|---|---|---|
| 4,689,529 | 8/1987 | Higuichi | 318/135 |
| 4,839,543 | 6/1989 | Beakley et al. | 310/12 |
| 4,859,974 | 8/1989 | Kliman et al. | 310/12 X |
| 4,868,431 | 9/1989 | Karita et al. | 310/12 |
| 5,212,416 | 5/1993 | Shimizu et al. | 310/12 |
| 5,518,550 | 5/1996 | Korenaga et al. | 118/729 |
| 5,608,773 | 3/1997 | Korenaga et al. | 378/34 |
| 5,648,691 | 7/1997 | Takei | 310/12 |
| 5,841,250 | 11/1998 | Korenage et al. | 318/135 |

FOREIGN PATENT DOCUMENTS

| | | |
|---|---|---|
| 0 768 705 | 4/1997 | European Pat. Off. . |
| 9-205764 | 8/1997 | Japan . |

OTHER PUBLICATIONS

K. Yamazaki, et al., "Development of a New Type Surface Actuator", Proceedings of the International Conference on Industrial Electronics, Control and Instrumentation, IEEE, Conf. 20, Sep. 5, 1994, pp. 509–513.

*Primary Examiner*—Clayton LaBalle
*Assistant Examiner*—Judson J. Jones
*Attorney, Agent, or Firm*—Fitzpatrick, Cella, Harper & Scinto

[57] ABSTRACT

A linear motor mechanism includes a stator element and a movable element being movable relative to the stator element in a predetermined direction through an electromagnetic drive force, wherein the stator element includes a yoke and coils disposed along a predetermined direction while the movable element includes a magnet with plural magnetic poles but with no yoke. Plural stator elements are disposed opposed to each other with a magnet of the movable element disposed therebetween.

36 Claims, 18 Drawing Sheets

LINEAR MOTOR MECHANISM FOR EXPOSURE APPARATUS, AND DEVICE MANUFACTURING METHOD USING THE SAME

FIELD OF THE INVENTION AND RELATED ART

This invention relates to a linear motor mechanism suitably usable in a stage system, for producing a drive force for moving or positioning an article. In another aspect, the invention is concerned with a stage system or an exposure apparatus using such a linear motor mechanism. In a further aspect, the invention concerns a device manufacturing method for manufacturing microdevices such as semiconductor devices, for example.

FIGS. 17A and 17B are schematic views for explaining a general structure of a stage system of a known example. FIG. 18 illustrates a driving sequence of such a stage system.

In FIGS. 17A and 17B, a movable stage 42 is slidably supported by a guide 41 which is fixedly mounted on a base. A workpiece 43 is placed on the stage 42. The stage 42 can be moved by a linear motor mechanism having components provided on the opposite sides of the stage 42. The linear motor mechanism includes stators 50 having plural coils 47 fixedly held by stator frames 48, and the stators are fixed to the base. The linear motor mechanism further includes movable elements 51 each having plural magnets 44, being magnetized in the vertical direction, and yokes 46 provided provided integrally with the magnets.

FIG. 18 illustrates driving a sequence for driving the movable element rightwardly, relative to the stator element. In operation, while detecting the relative positional relation of the coils 47 and the magnets 44 by using sensor means (not shown), a coil at a position spaced by a predetermined electrical angle is selected and an electrical current is sequentially applied thereto in an appropriate direction, by which a drive force is produced between the stator element and the movable element.

In the above-described structure, however, the movable element comprises magnets and yokes, and both of them move together with the stage. While the magnets and the yokes have substantially the same specific gravity and also substantially the same volume, only the magnets contribute to the production of a thrust force. Namely, in the linear motor mechanism of the above-described structure, an additional mass of the yoke not contributable to the thrust has to be moved. This leads to enlargement in the size of the power source, increased heat generation, decreased servo gain due to a reduction of the natural frequency of the entirely of the movable components, or degradation of the transient response to position designation, for example.

Further, in order to produce a large thrust, the thickness of the yoke has to be large so as not to cause magnetic flux saturation. Thus, enlargement of the thrust force and reduction in the size of the mechanism are incompatible.

SUMMARY OF THE INVENTION

It is accordingly an object of the present invention to provide a linear motor mechanism having improved performance of reduced heat generation, improved control response, reduced size, or enlarged thrust force, for example.

It is another object of the present invention to provide a stage system or an exposure apparatus having such a linear motor mechanism.

It is a further object of the present invention to provide a device manufacturing method using such an exposure apparatus.

In accordance with an aspect of the present invention, there is provided a linear motor which comprises; a plurality of stator elements each having a yoke and coils disposed along a predetermined direction; and a movable element having magnet means with plural magnetic poles; wherein said stator elements are disposed opposed to each other with said magnet means of said movable element disposed between the opposed stator elements.

In accordance with another aspect of the present invention, there is provided a linear motor which comprises: a stator element having a yoke and plural coils disposed along a predetermined direction; and a movable element having a magnet with plural magnetic poles but having no yokes.

In accordance with a further aspect of the present invention, there is provided a linear motor which comprises: a stator element having a yoke, a first coil wound on said yoke along a first direction, and a second coil wound on said yoke along a second direction different from said first direction; and a movable element having a magnet but having no yoke.

The yoke may have a shape being elongated in one direction, wherein said first direction may correspond to the lengthwise direction of said yoke, and wherein said second direction may be perpendicular to the lengthwise direction of said yoke.

In accordance with a yet further aspect of the present invention, there is provided a stage system which includes a linear motor as recited above, for moving a stage.

In accordance with a still further aspect of the present invention, there is provided an exposure apparatus which includes a stage system as recited above, for performing an exposure process to an article held by said stage system.

The exposure apparatus may preferably comprise a scan type exposure apparatus.

In accordance with a still further aspect of the present invention, there is provided a device manufacturing method, comprising the steps of: preparing an exposure apparatus as recited above; and transferring a pattern of an original onto a substrate by using the exposure apparatus.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

[Embodiment 1]

Figure 1A:
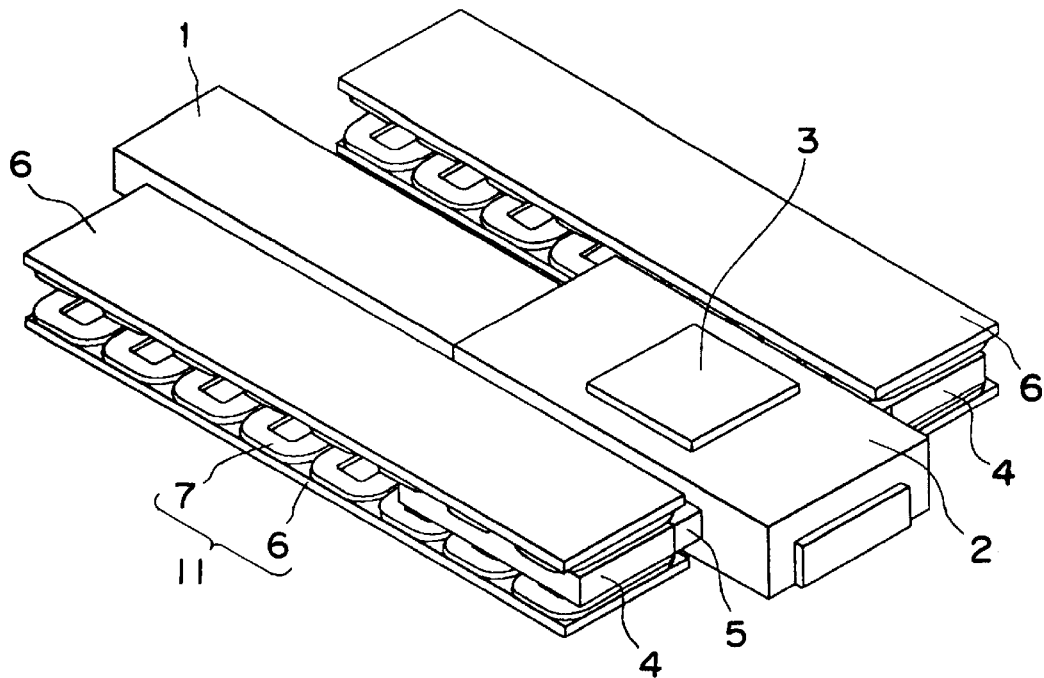
FIGS. 1A and 1B are schematic and perspective views for explaining a linear motor mechanism according to a first embodiment of the present invention.
Figure 1B:
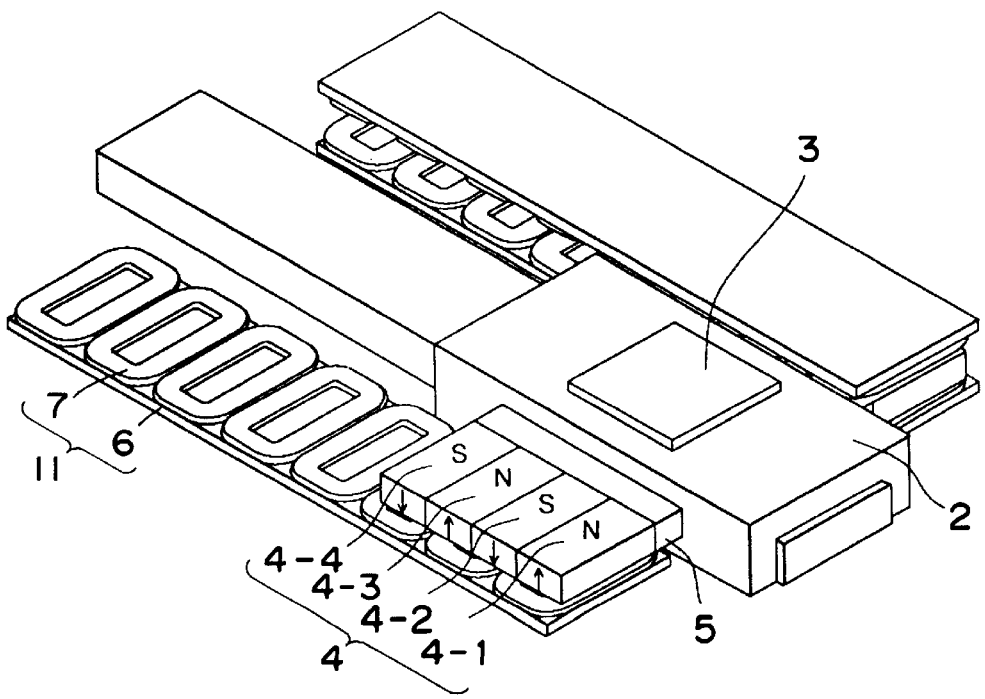
Figure 2:
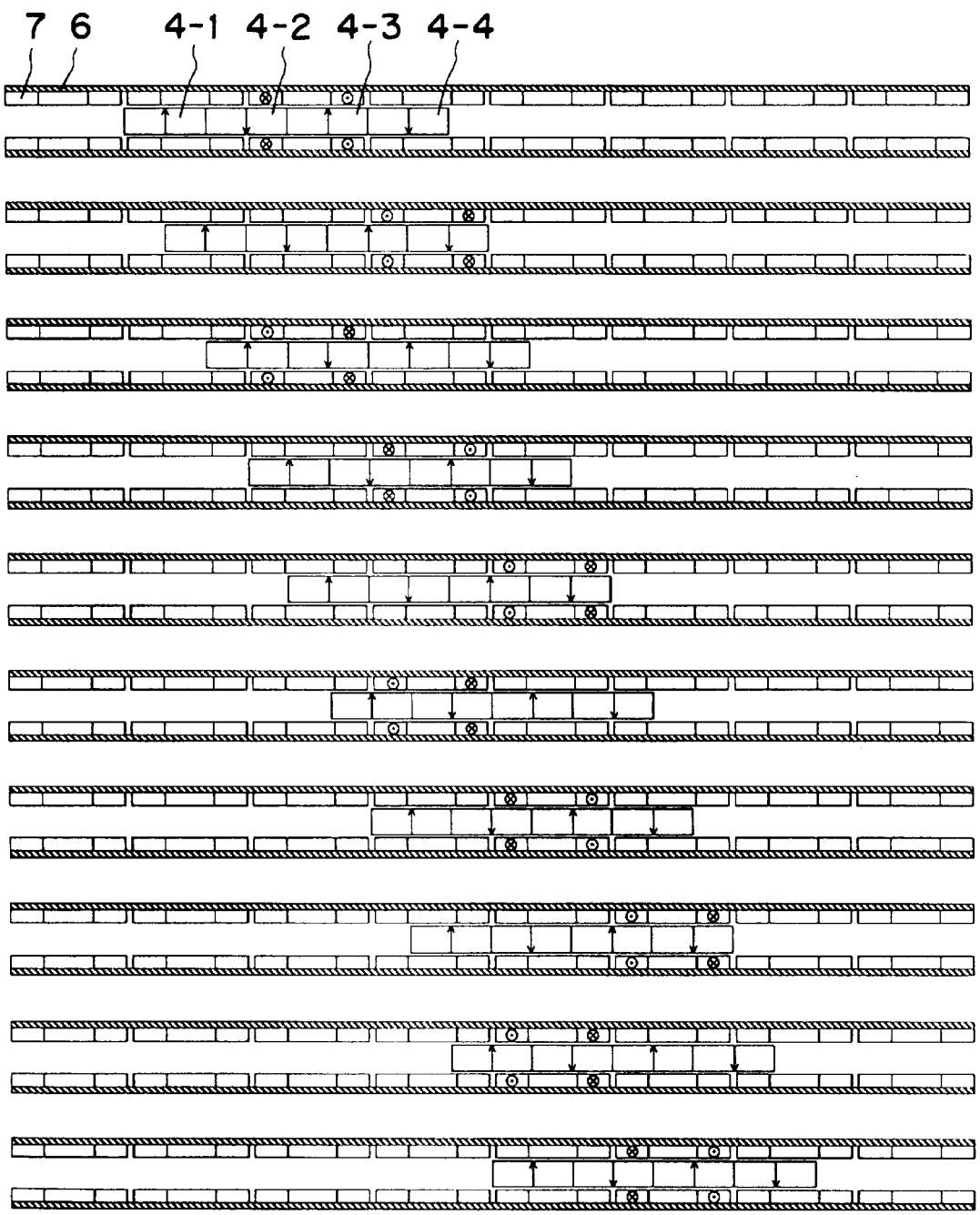
FIG. 2 is a schematic view for explaining a drive sequence in the first embodiment of the present invention.

FIGS. 1A and 1B show a stage system having a linear motor mechanism, according to a first embodiment of the present invention, wherein FIG. 1A is a perspective view and FIG. 1B is a partly exploded view for explaining the structure of magnets. FIG. 2 is a schematic view for explaining a drive sequence of the stage system of FIG. 1A.

In these drawings, a guide 1 has an elongated shape extending in the driving direction, and it is fixedly mounted on a base, not shown. A stage 2 is slidably supported by the guide 1 through static pressure bearing means or roll bearing means, for example. An article 3, which is, in this embodiment, a reticle to be used in an exposure process, is an object to be positioned, and it is placed on the stage 2. Two linear motors are provided on opposite sides of the stage 2. These linear motors are used as a drive source for moving the stage 2 in the driving direction.

Each linear motor includes a movable element which comprises four magnets 4-1, 4-2, 4-3 and 4-4 disposed so that the N and S poles being magnetized in the vertical direction are arrayed alternately. These magnets are adhered to a holding member 5, by which they are fixed to a side face of the stage 2. This movable element is disposed between and opposed, without contact, to coils of upper and lower stator units 11, respectively.

The stator means of each linear motor includes upper and lower stator units 11, at one side of the stage 2. Thus, there are four stator units 11 at left-hand and right-hand sides of the stage 2, in total. Each stator unit 11 comprises plural (e.g., eight) coils 7 which are fixed to a yoke 6. The upper and lower stator units 11 are so disposed that their coils are opposed to each other. Each stator unit 11 is fixed to the base which supports the guide 2.

Each coil 7 comprises a flat coil. On the other hand, relative motion between the magnet 4 and the yoke 6 causes an eddy current in the yoke 6. To reduce it, the yoke 6 is made from a laminated steel plate.

Figure 17A:
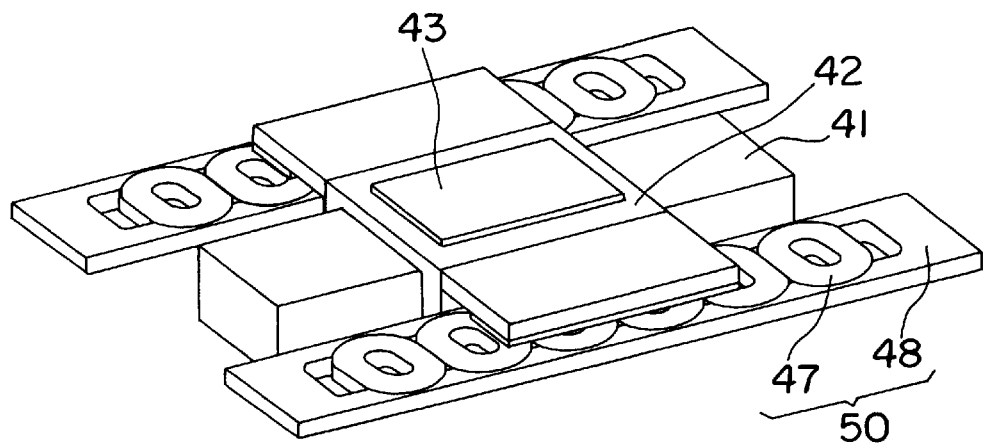
FIGS. 17A and 17B are schematic views for explaining a stage mechanism of a known type.
Figure 17B:
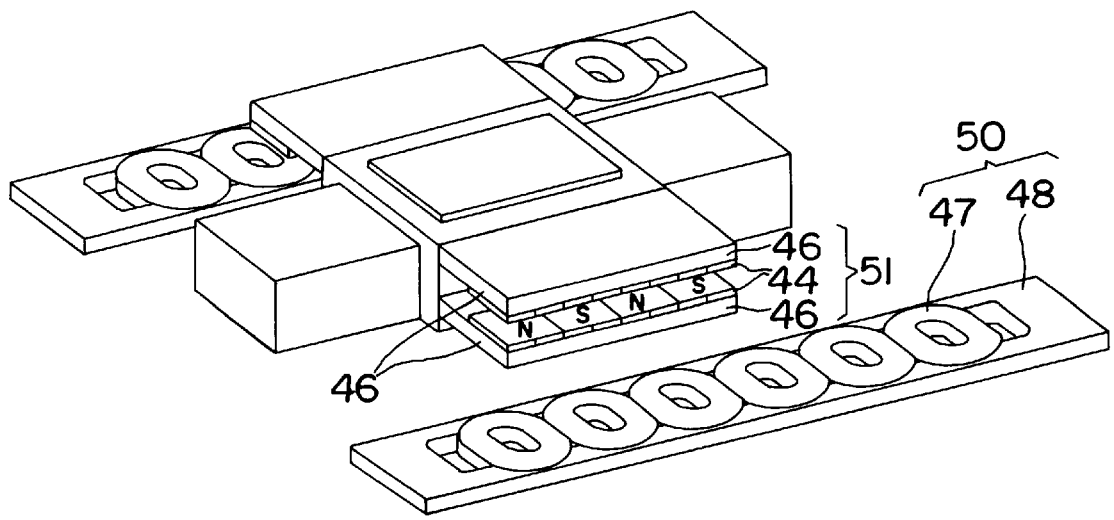
Figure 18:
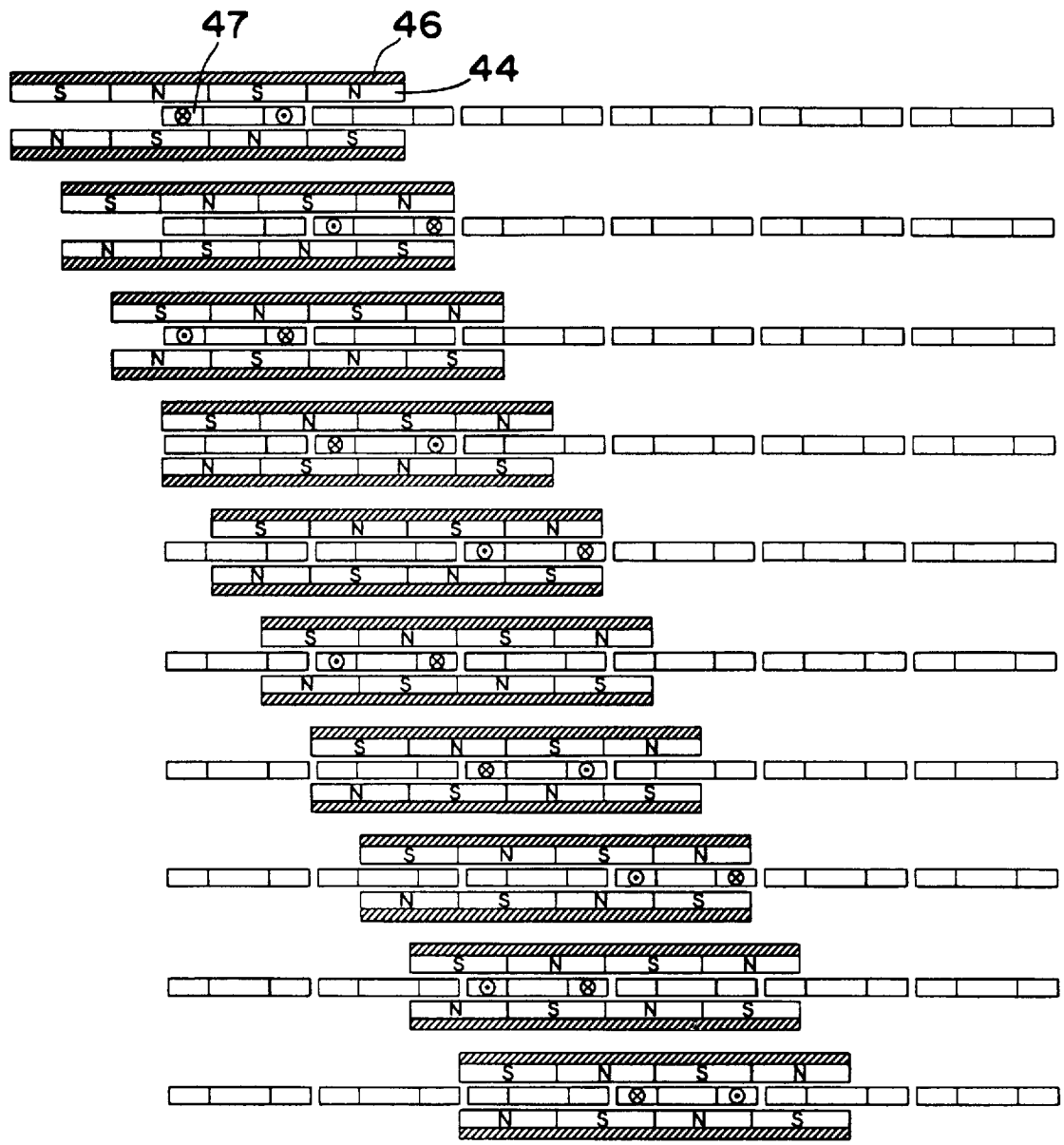
FIG. 18 is a schematic view for explaining a drive sequence of the stage mechanism shown in FIG. 17A or 17B.

In the structure described with reference to FIGS. 17A and 17B, the size of the yoke 46 in the driving direction corresponds to the total length of the movable magnet. In this embodiment, since the yoke is provided on the stator side, the yoke 6 should have a size in the driving direction corresponding to the total length of the eight coils in the driving direction.

The eight coils of the stator unit 11 are disposed along the driving direction at a pitch 1.5 times larger than the magnetic pole pitch. Since the magnetic pole pitch corresponds to a ½ (half) period of the basic wave of magnetic flux density, the pitch of the eight coils corresponds to a ¾ (0.75) period of the basic wave of the magnetic flux density. In terms of electrical angle, it is 270 deg. or −90 deg.

FIG. 2 illustrates a drive sequence for moving the movable element rightwardly. While detecting the relative position of the coil 7 and the magnet 4 by using a position sensor (e.g., a laser interferometer to be described later) disposed outside, those coils which are at positions spaced by an electrical angle 270 deg. or −90 deg. are selected and an electrical current is applied sequentially to these coils in an appropriate direction, such that a drive in the same direction is produced. Although the coils have eight phases in the sense that coils having orthogonal electrical angles are sequentially switched, they can be considered as a two-phase motor.

In this embodiment, the yoke 6 is provided on the stator side. This results in that the mass of the movable element, which is the moving component of the linear motor, is reduced approximately to a half. Further, a magnet having plural magnetic poles is provided on the movable element As a result of this, a small magnetic path loop is formed and, consequently, the region in which the thrust of the linear motor with respect to the electrical current becomes linear is widened. Moreover, as a result of the arrangement that the yoke is provided on the stator side while the stator units are disposed opposed to each other to sandwich plural magnets of the movable element therebetween, small magnetic path loops of the magnets can be effectively used from both sides of the magnets. This is effective to produce an enlarged thrust force. Consequently, both of enlargement of thrust and reduction in weight are assured, and a control response of the system is improved.

Further, as a result of the arrangement that the stator units are disposed opposed to each other and that the magnet is disposed between them, the attracting force of the magnet acting in any direction other than the moving direction of the linear motor is canceled. Thus, a stable thrust force can be produced.

Further, using a laminated steel plate for the yoke 6 is effective to reduce an eddy current to be produced in the yoke during relative motion between the yoke and the magnet 4. This ensures high speed and high precision positioning.

[Embodiment 2]

Figure 3:
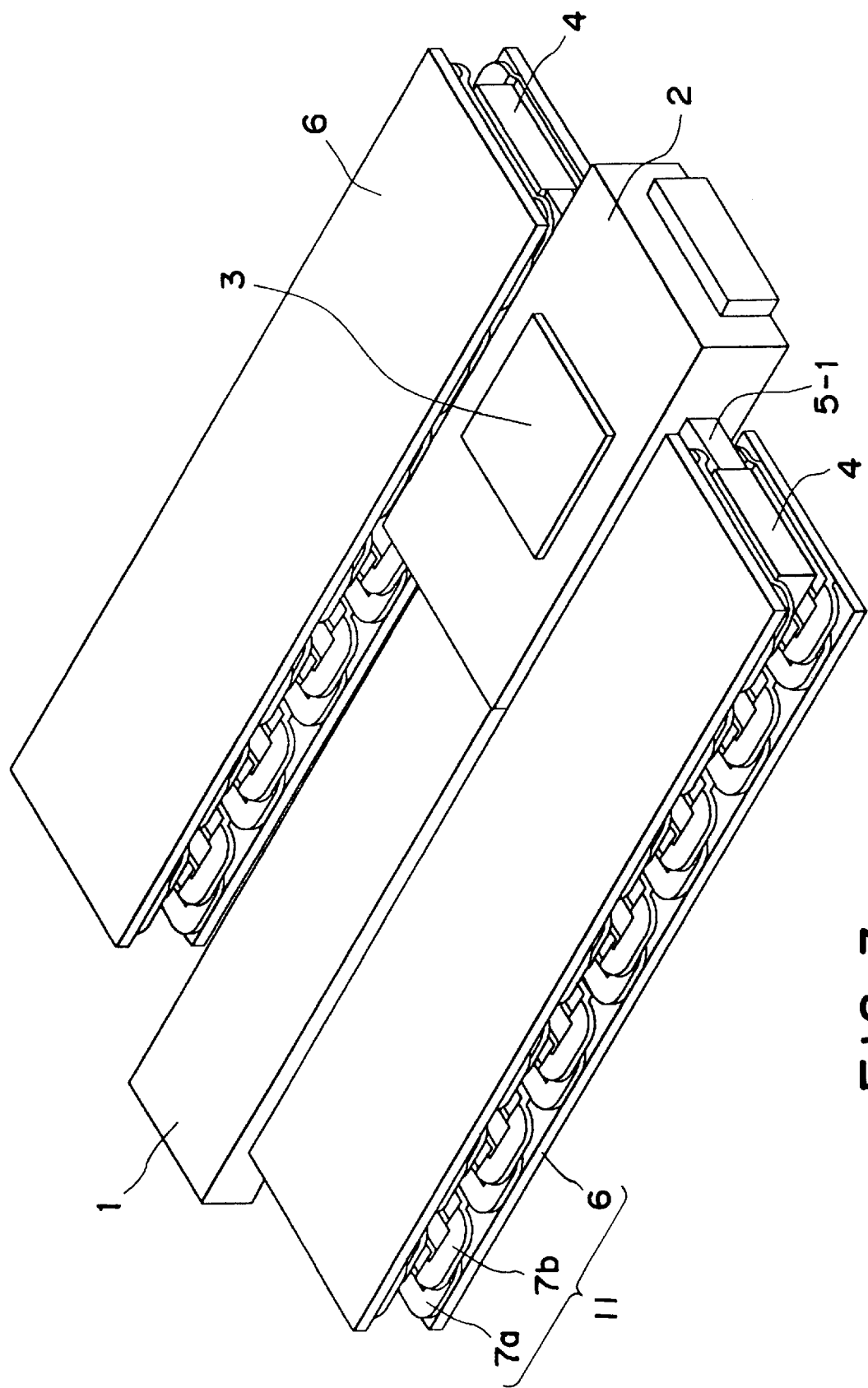
FIG. 3 is a schematic and perspective view for explaining a linear motor mechanism according to a second embodiment of the present invention.
Figure 4:
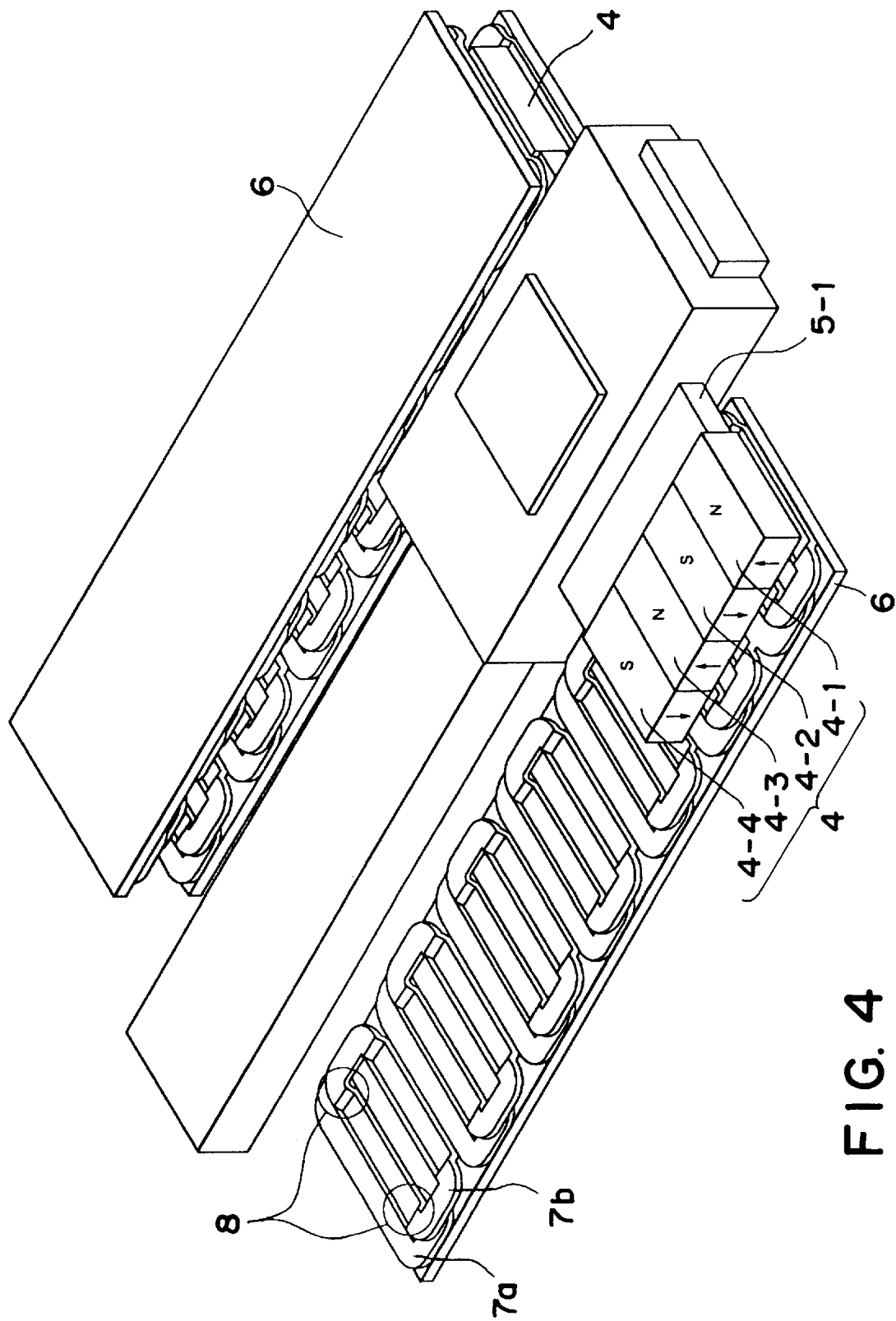
FIG. 4 is a partly exploded view for explaining details of the linear motor mechanism according to the second embodiment of the present invention.
Figure 5:
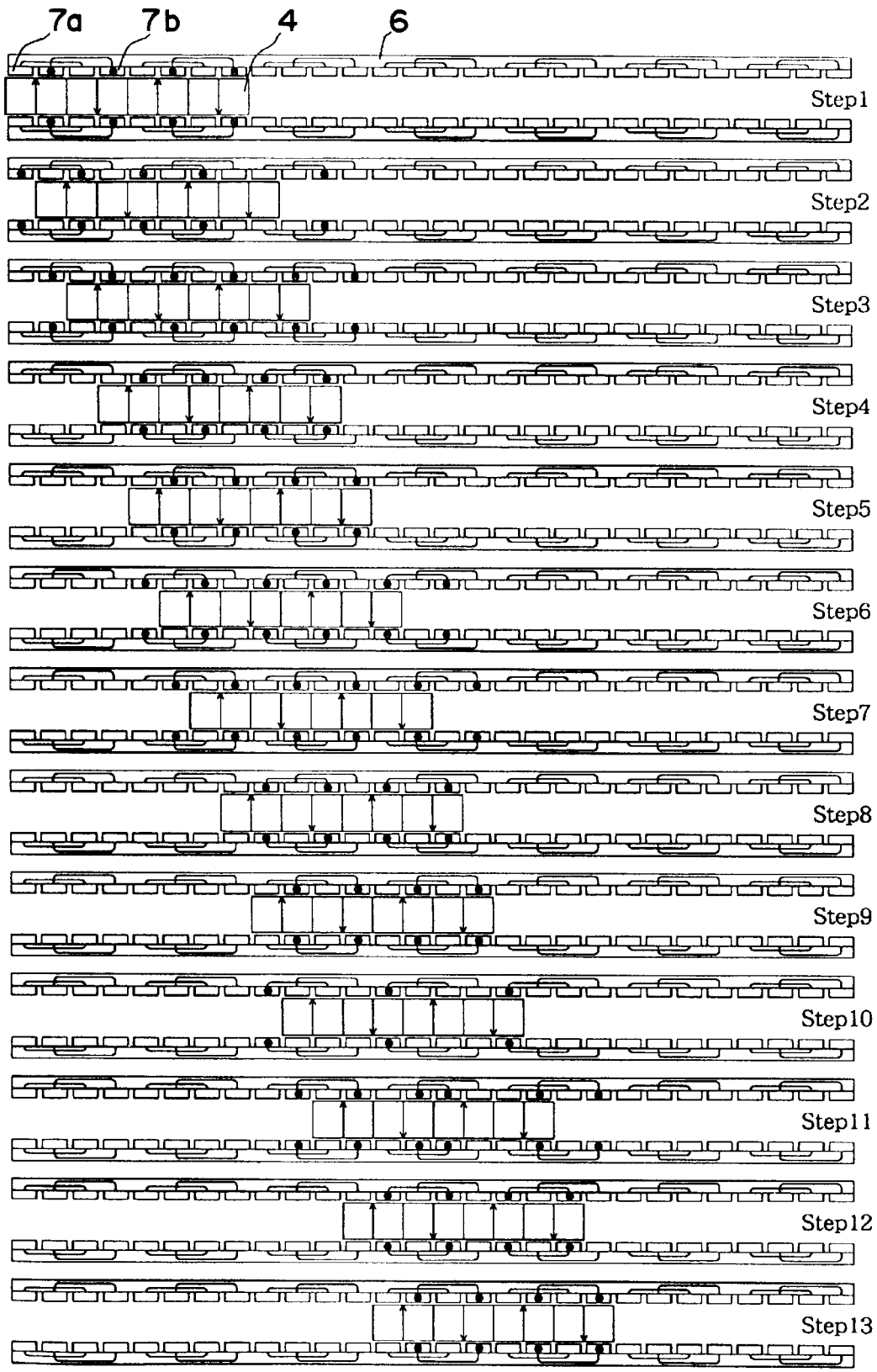
FIG. 5 is a schematic view for explaining a drive sequence in the second embodiment of the present invention.

A second embodiment of the present invention will be described. FIG. 3 is a perspective view, and FIG. 4 is a partly exploded view. FIG. 5 is a schematic view for explaining a drive sequence. Like numerals as those of the first embodiment described above are assigned to corresponding components, and a duplicate description thereof is omitted.

In this embodiment, at each side, the linear motor stator means comprises upper and lower stator units 11 each having fourteen (14) coils (flat coils) fixed to a yoke 6. The fourteen flat coils comprise seven A-phase coils 7A and seven B-phase coils 7B disposed alternately. Namely, a pair of A-phase coils 7A and B-phase coils 7B are disposed along the driving direction with a mutual phase shift, to provide a coil unit. Each stator unit comprises seven such coil units arrayed along the driving direction and fixed to the yoke.

In the preceding embodiment, the coils are arrayed along the driving direction without overlapping, and they are disposed at a pitch 1.5 times larger than the magnetic pole pitch. In this embodiment, on the other hand, two coils of phase A and phase B are disposed along the driving direction with mutual overlapping and with mutual phase shift, and they are combined into a single coil unit. Plural such coil units are provided along the driving direction. Thus, the magnetic poles of the coils are disposed in an array with 0.5 pitch. In other words, an adjacent A-phase coil 7A and a B-phase coil 7B are disposed at a pitch 0.5 times the magnetic pole pitch, and the A-phase coils (or B-phase coils) are disposed at a pitch the same as the magnetic pole pitch. Here, since the distance between centers of the sides of the flat coils contributable to the thrust is equal to the magnetic pole pitch, in order that adjacent A-phase coils and B-phase coils are disposed at a pitch 0.5 times the magnetic pole pitch, the A-phase coil and B-phase coil may well be disposed with a mutual shift corresponding to a half of the magnetic pole pitch.

However, with a simple shift, coils are superposed in the vertical direction and the thickness of the coils in the vertical direction becomes twice. Then, the clearance as seen from the magnet increases, which causes a reduction of the magnetic flux density and thus, a reduction of thrust. Also, the size of the whole mechanism in the vertical direction is enlarged. In this embodiment, in consideration of the above, as shown in FIG. 4 there are bent portions 8 each being defined in a B-phase coil 7B, at a portion opposed to the movable magnet, with the side opposed to the magnet being protruded or extracted as compared with the side not opposed to the magnet 4, such that the portion of the B-phase coil 7B opposed to the movable magnet is placed substantially on the same plane as the A-phase coil 7A. With this structure, the clearance between the magnet 4 and a the coils 7A and 7B can be kept small, and reduction of thrust and enlargement in size of the whole mechanism in the vertical direction can be prevented. Although there is overlapping at the portions of the A-phase coil and B-phase coil not opposed to the magnet, the size in the vertical direction of the holding member 5-1 for fixedly mounting the movable magnet to the stage is made smaller than the size of the movable magnet 4 in the vertical direction, to avoid this overlapping portion.

Since the magnetic pole pitch corresponds to a ½ (half) period of the basic wave of magnetic flux density, the pitch of the fourteen coils corresponds to a ¼ (0.25) period of the basic wave of magnetic flux density. In terms of electrical angle, it is 90 deg. In accordance with the drive sequence of FIG. 5, while detecting the relative position of the coils 7A and 7B and the magnet 4 by using a position sensor, those coils at positions spaced by 90 deg. are selected, and an electrical current is applied sequentially in an appropriate direction, to produce a drive in the same direction. Here, the amount of electrical current contributable to the thrust with respect to the movable magnet 4 is twice that in the first embodiment. This is because coils with a 90 deg. phase shift are superposedly disposed and because the number of coils opposed to the magnet is twice as compared with the first embodiment. Thus, the efficiency is very good in that the thrust constant is twice with the same movable mass.

In FIG. 5, at steps 1, 4, 5, 8, 9, 12 and 13, four coils are actuated at each side of the stage. On the other hand, at steps 2, 3, 6, 7, 10 and 11, six coils are actuated at each side of the stage. On average, five coils are actuated at each side of the stage. As compared therewith, in FIG. 2 of the first embodiment, two coils are actuated at each side of the stage. Thus, the coil resistance in this embodiment is 2.5 times larger than that of the first embodiment. On the other hand, since the thrust constant is twice, for the same mass and the same acceleration, the required electrical current is a half. Therefore, the heat generation is 2.5/2/2, that is, 0.63 times, and thus, the heat generation is reduced.

As described, with this embodiment of the present invention, in addition to the advantageous results of the first embodiment, there is provided an advantageous result of improved efficiency and reduction of heat generation.

Further, like the preceding embodiment, the yoke is made from a laminated steel plate. This reduces an eddy current to be produced in the yoke during relative motion of the magnet and the yoke, and it enables high speed and high precision positioning.

[Embodiment 3]

Figure 6:
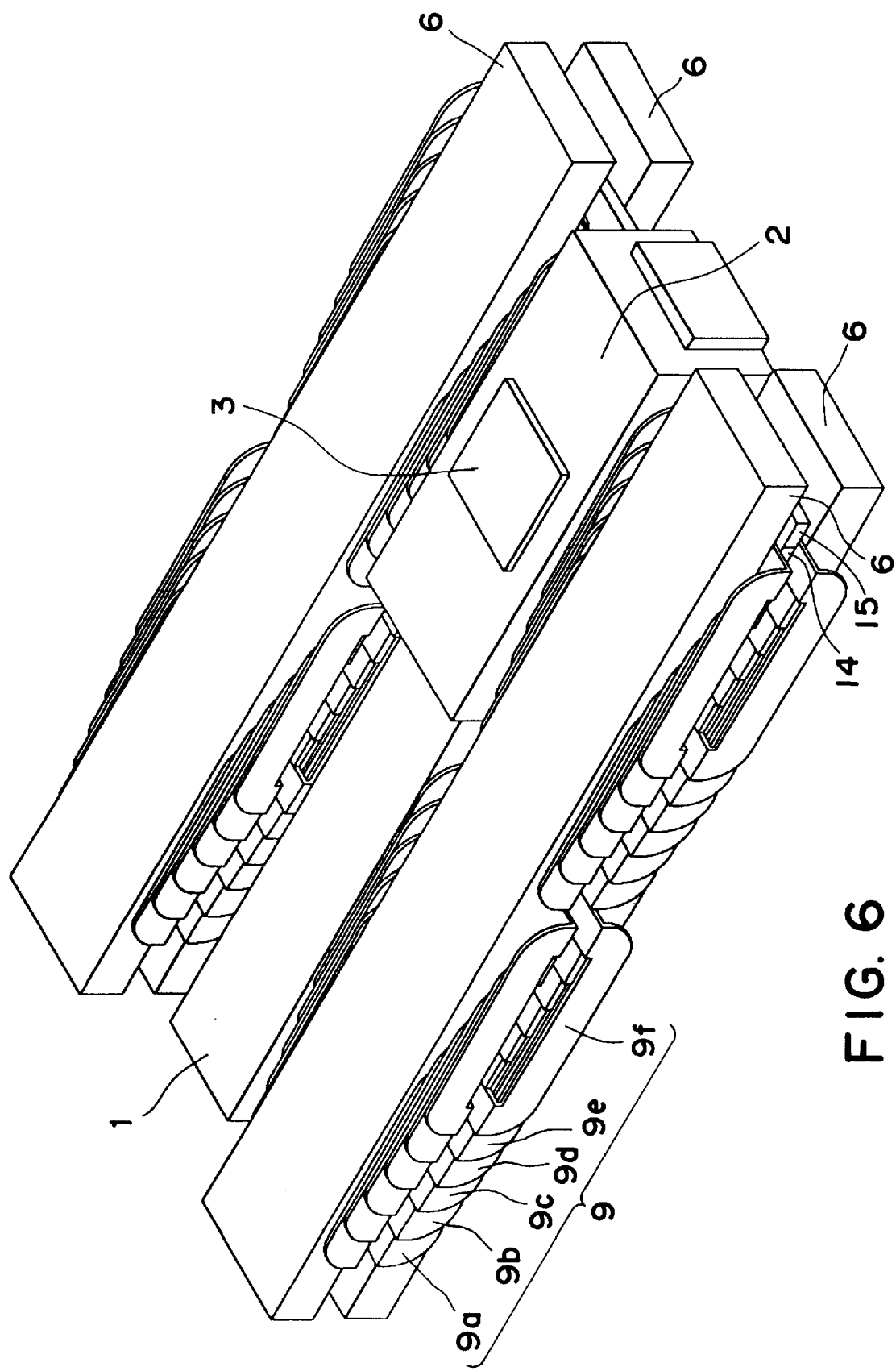
FIG. 6 is a schematic and perspective view for explaining a linear motor mechanism according to a third embodiment of the present invention.
Figure 7:
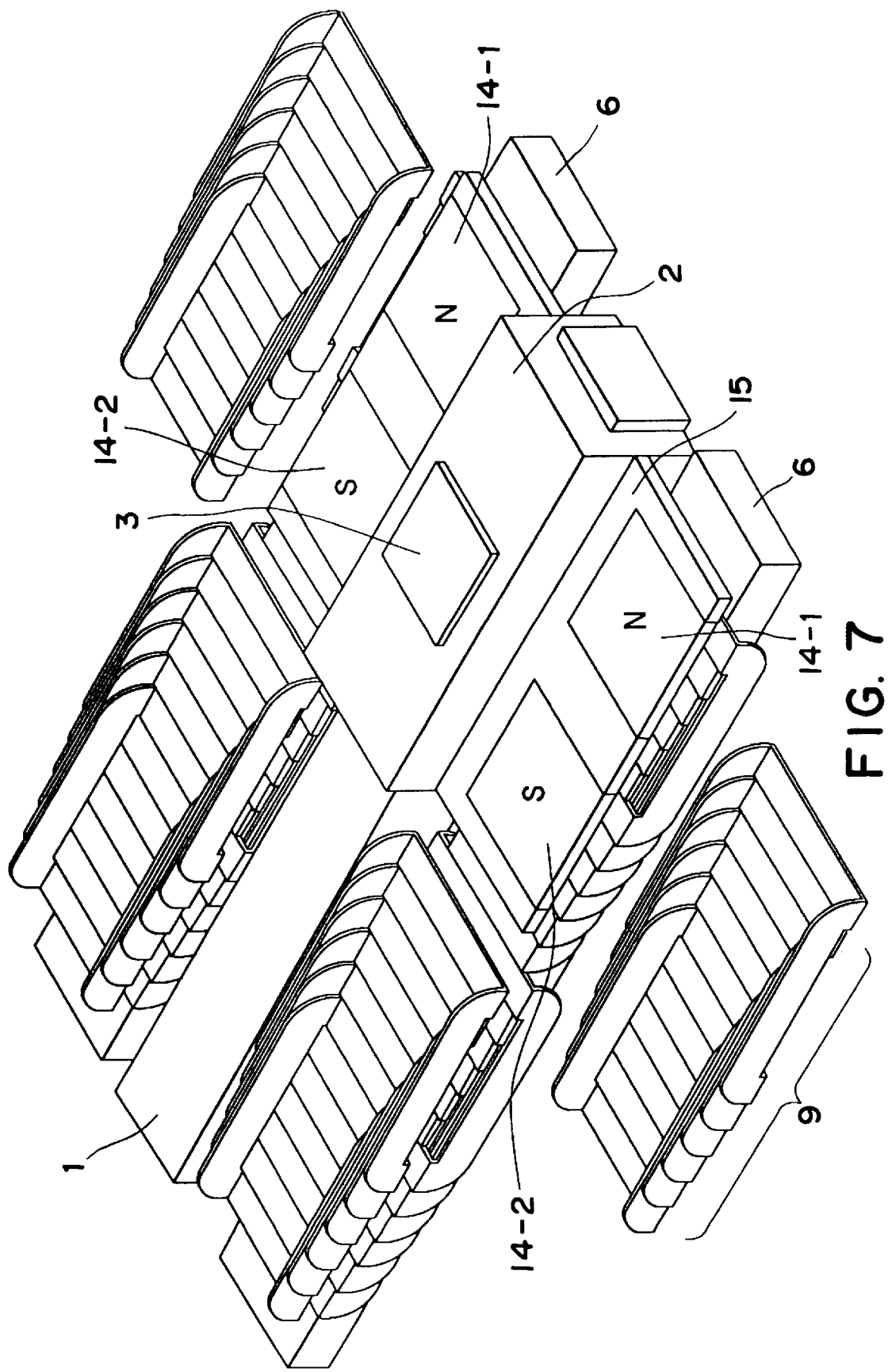
FIG. 7 is a partly exploded view for explaining details of the linear motor mechanism according to the third embodiment of the present invention.
Figure 8:
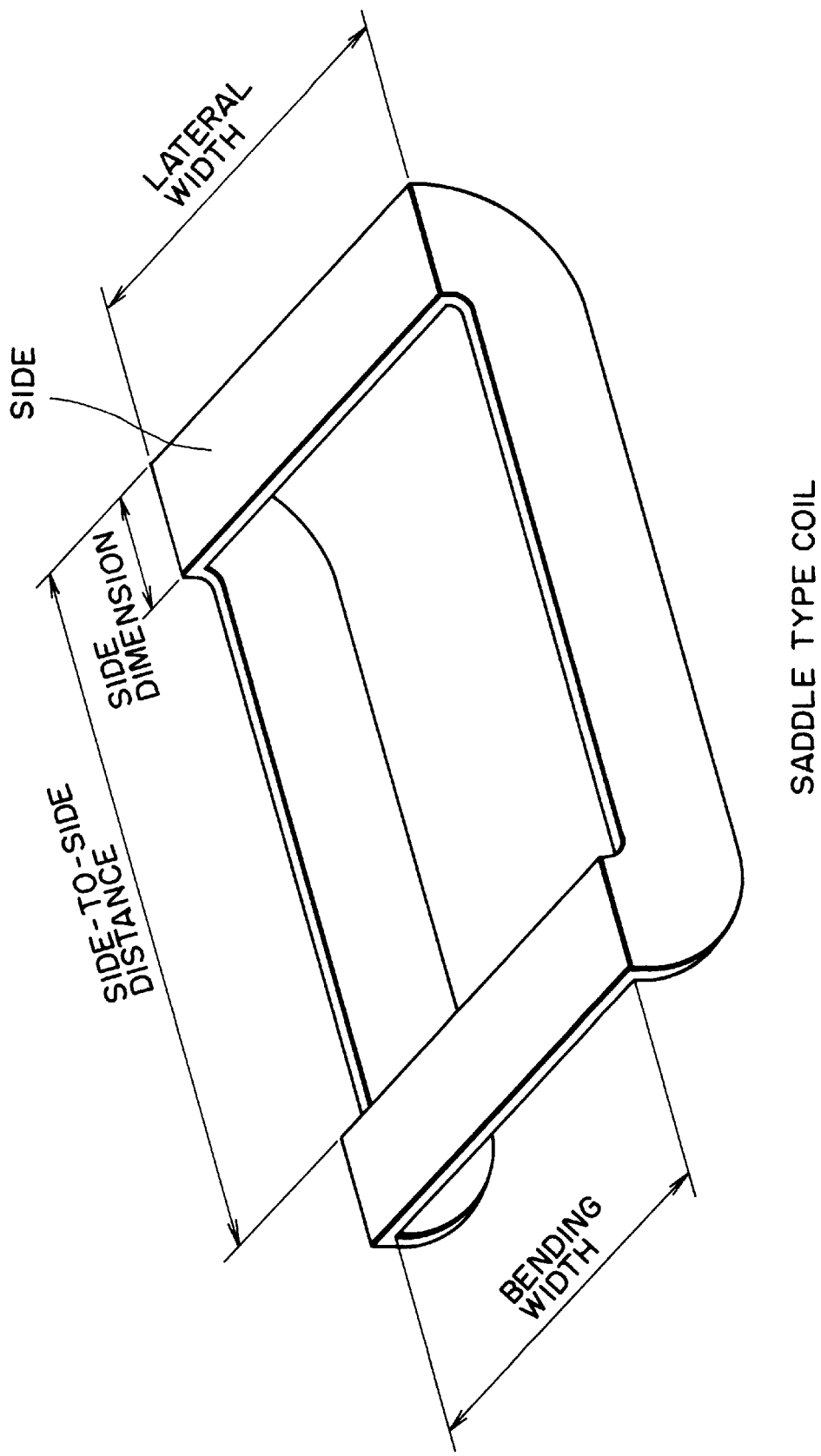
FIG. 8 is a schematic view of a single coil used in the third embodiment of the present invention.
Figure 9:
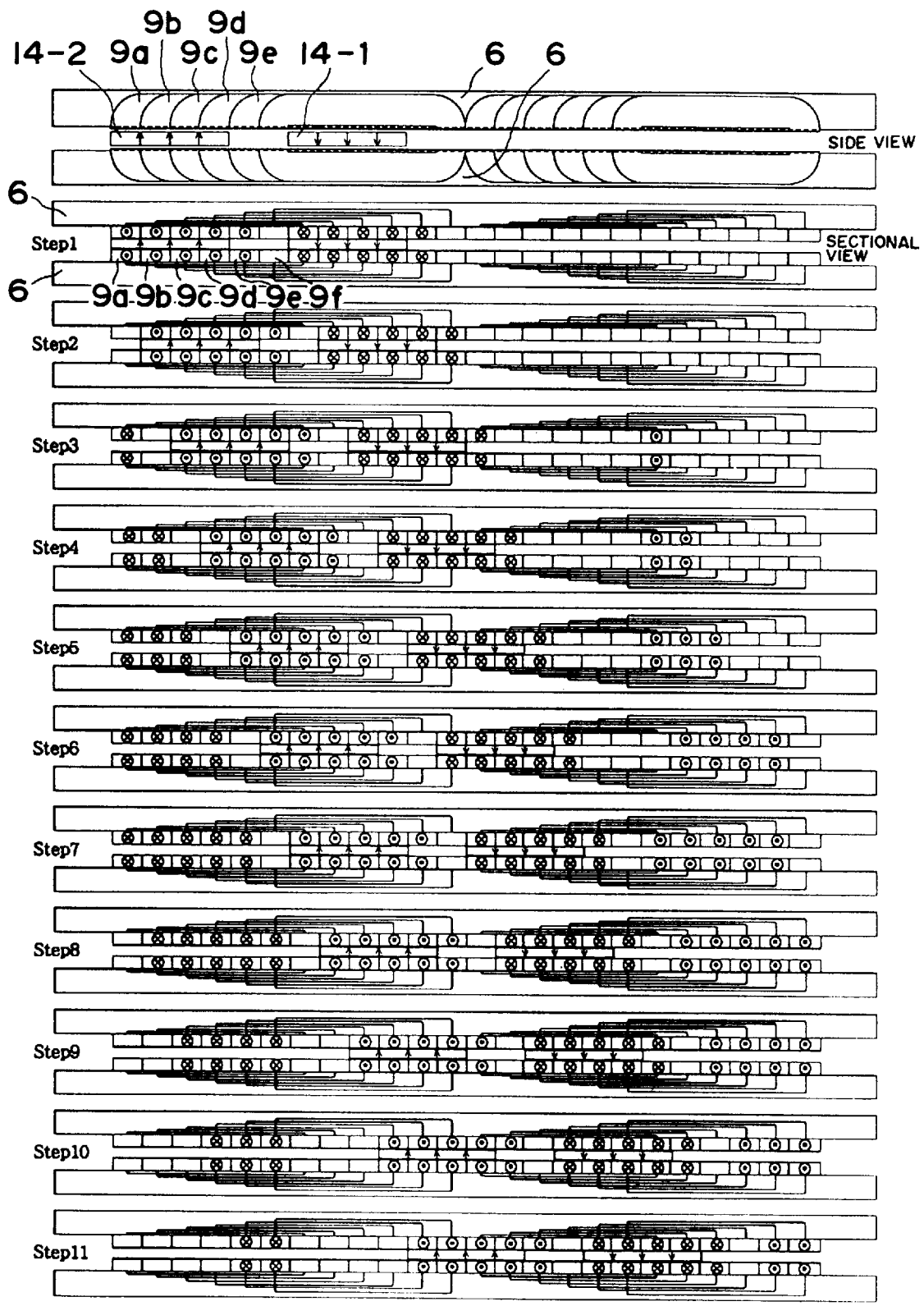
FIG. 9 is a schematic view for explaining a drive sequence in the third embodiment of the present invention.

A third embodiment of the present invention will be described. FIG. 6 is a perspective view, and FIG. 7 is a partly exploded view. FIG. 8 shows details of a saddle type coil. FIG. 9 is a schematic view for explaining a drive sequence. Like numerals as those of the preceding embodiments described are assigned to corresponding components, and a duplicate description thereof is omitted.

In the first and second embodiments described above, with respect to the size in the driving direction, there is a relation "(size of magnet)>(size of coil energized)". This means that there is a portion in the magnet, which portion does not contribute to the thrust. In this embodiment, the structure is arranged to satisfy the relation with respect to the size in the driving direction that "(size of magnet)<(size of coil energized)", such that the whole of the magnet can contribute to the thrust.

The linear motor has a movable element which comprises, as shown in FIG. 7, a pair of magnets 14-1 having an N-pole at their upper face and a pair of magnets 14-2 having an S-pole at their upper face, all of which are fixed to a stage 2 through a holding member 15.

On the other hand, the stator of the linear motor comprises upper and lower stator units each having twelve saddle shaped coils, of a shape such as shown in FIG. 8, which are fixed Lo a yoke 6. While the saddle shaped coil of FIG. 8 can be provided by bending both sides of a flat coil, because of the difference in bending width such as illustrated, this embodiment uses six types in regard to the shape of the coil, from an A-phase saddle coil 9A having a smallest bending width to an F-phase saddle coil 9F having a largest bending width.

In each type of saddle shaped coil, the side-to-side distance in FIG. 8 is six times larger than the side dimension. In order that the saddle coil set 9 shown in the exploded view of FIG. 7 is provided by six saddle coils, first, relative to the A-phase saddle coil 9A of smallest bent width, the B-phase saddle coil 9B is disposed with a shift corresponding to the side dimension. Subsequently, a C-phase saddle coil 9C is disposed with a shift corresponding to the side dimension. A similar procedure is repeated up to the F-phase saddle coil 9F, whereby the saddle coil set 9 is accomplished. For this reason, six type coils having different bend widths are necessary. With this arrangement, in a single saddle coil set 9, the sides opposed to the movable magnet can be placed on the same plane. Two saddle coil sets 9 as described are fixedly mounted on a single yoke 6, by which a single stator unit is provided. The whole stage system comprises upper and lower stator units disposed with their coils opposed to each other, at each of the left-hand side and right-hand side of the stage. These stator units are fixed to a base (not shown) by means of a fixing member, not shown.

The movable element comprises magnets held by the holding member 15. As shown in FIG. 7, two single-pole magnets 14-1 and 14-2 having their vertically magnetized magnetic poles disposed oppositely are fixed to the stage through the holding member 15. These two magnets are disposed so that they can move between opposed coils of the upper and lower stator units. Each of the single-pole magnets 14-1 and 14-2 has a width in the driving direction which is four times larger than the side dimension of the saddle shaped coil of FIG. 8. Also, the distance in the driving direction between two single-pole magnets 4 separated by the holding member 15 is twice the side dimension of the saddle shaped coil.

The drive sequence is similar to that of the preceding embodiments in the point that the drive coils are selectively switched in accordance with the relative position of the magnets and coils. However, as shown in FIG. 9, in regard to the size in the driving direction, at least those coils corresponding to a size 1.25 times the magnet size are constantly energized. In steps 1 and 2 where coils to be energized are all included in a single saddle coil set, the size in the driving direction of the coils to be energized is only 1.25 times the size of the magnet in the driving direction. However, when, as the motion of the magnet, the coils to be energized are included in two adjacent saddle coil sets, the size in the driving direction of the coils to be energized increases. At the maximum, in steps 7 and 8, it becomes 2.5 times the size of the magnet in the driving direction. For this reason, in an apparatus wherein the acceleration or deceleration region is held fixed, the acceleration or deceleration region may preferably be set at positions where the coils to be energized are included in a single saddle coil set. This may be a best design in with respect to heat generation.

In accordance with this embodiment of the present invention, in addition to the advantageous effects attainable with the preceding embodiment, since the coils opposed to the magnets are constantly energized, all the magnets can contribute to the thrust. Thus, the thrust per a unit movable element mass is enlarged and, therefore, further improvement of the drive efficiency is assured.

Further, like the preceding embodiments, the yoke is made from a laminated steel plate. This reduces an eddy current to be produced in the yoke during relative motion of the magnet and the yoke, and it enables high speed and high precision positioning.

[Embodiment 4]

Figure 10:
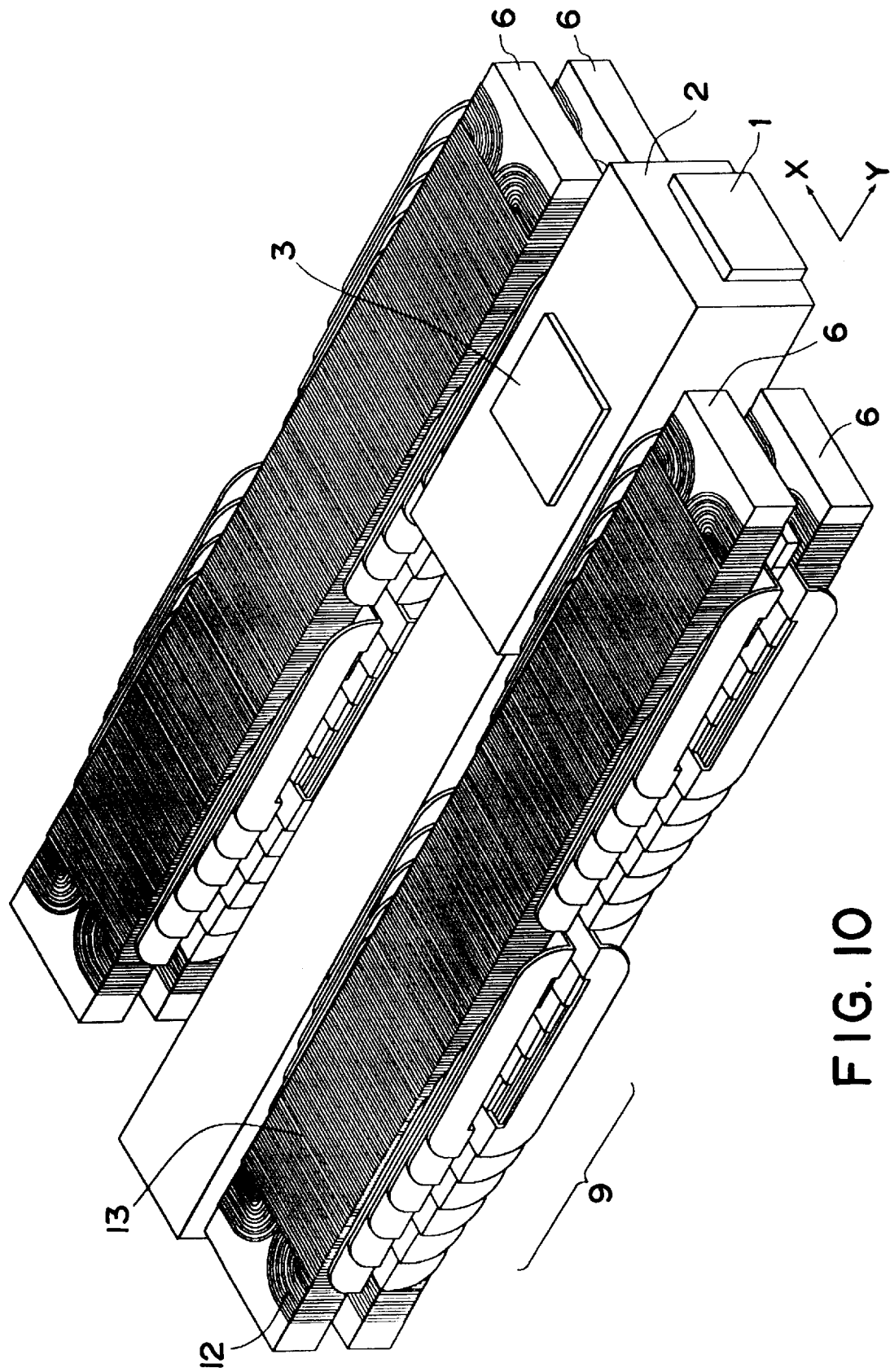
FIG. 10 is a schematic and perspective view for explaining a linear motor mechanism according to a fourth embodiment of the present invention.
Figure 11:
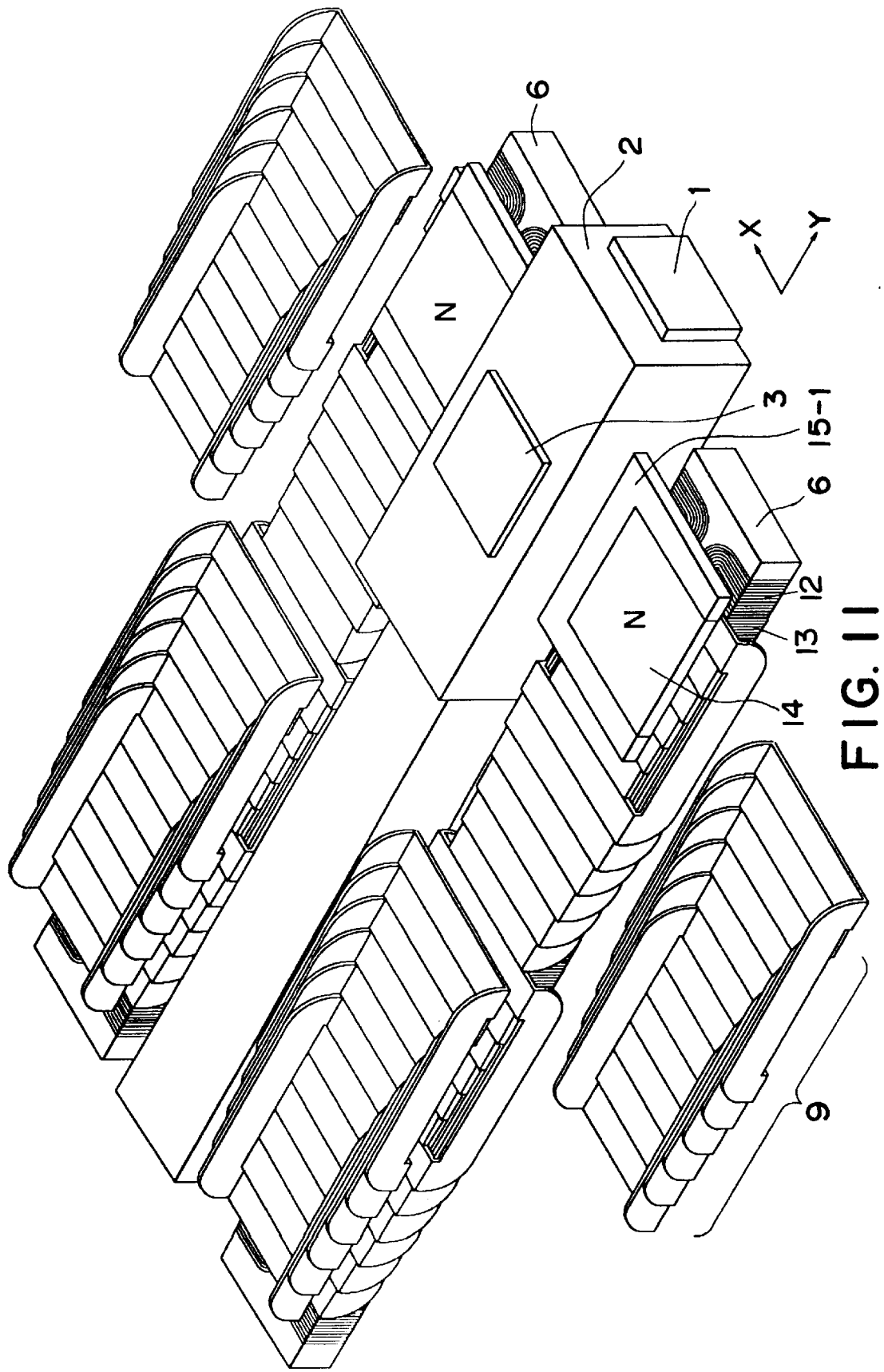
FIG. 11 is a partly exploded view for explaining details of the linear motor mechanism according to the fourth embodiment of the present invention.
Figure 12:
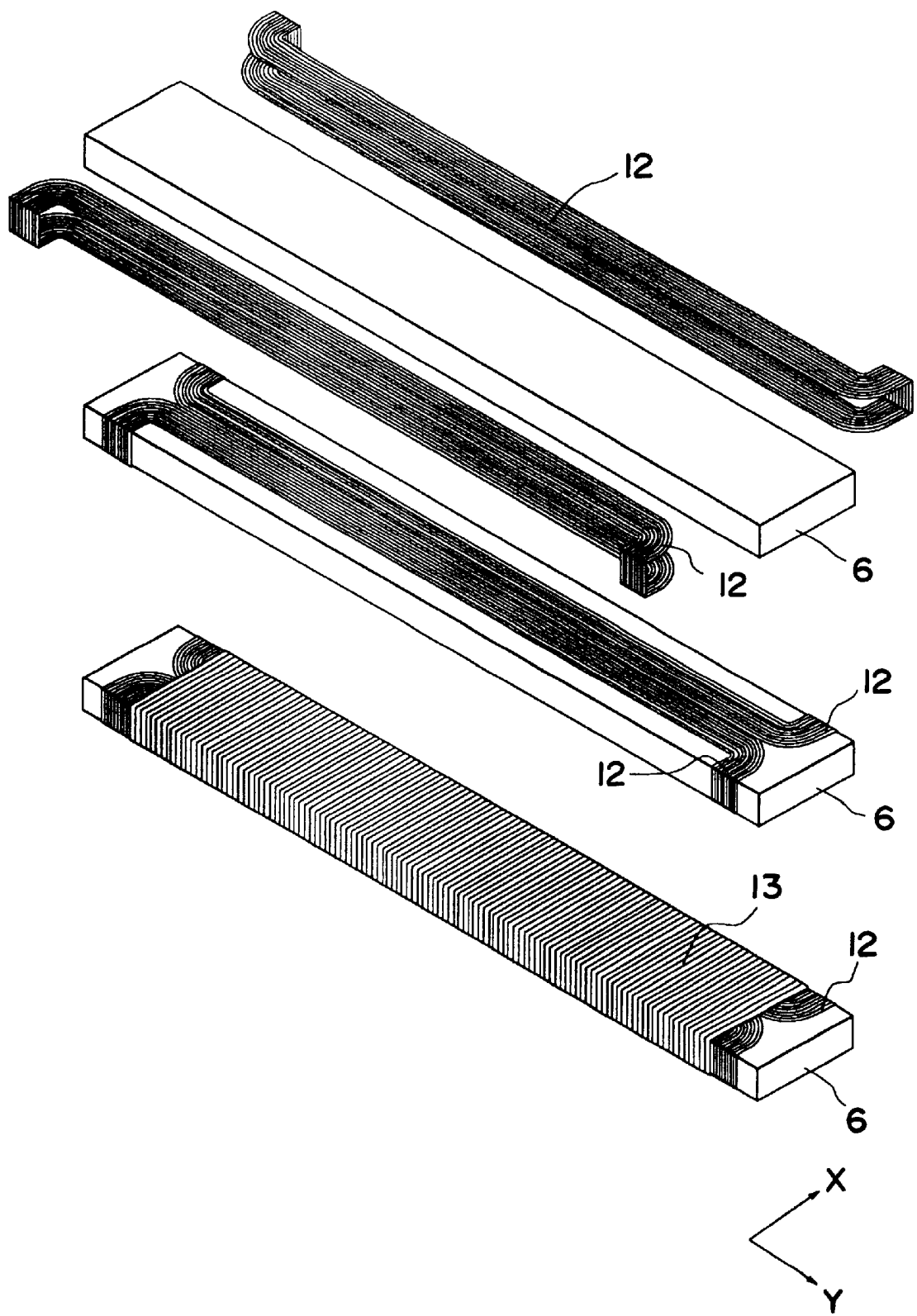
FIG. 12 is a schematic view for explaining a fine-motion coil used in the fourth embodiment of the present invention.
Figure 13:
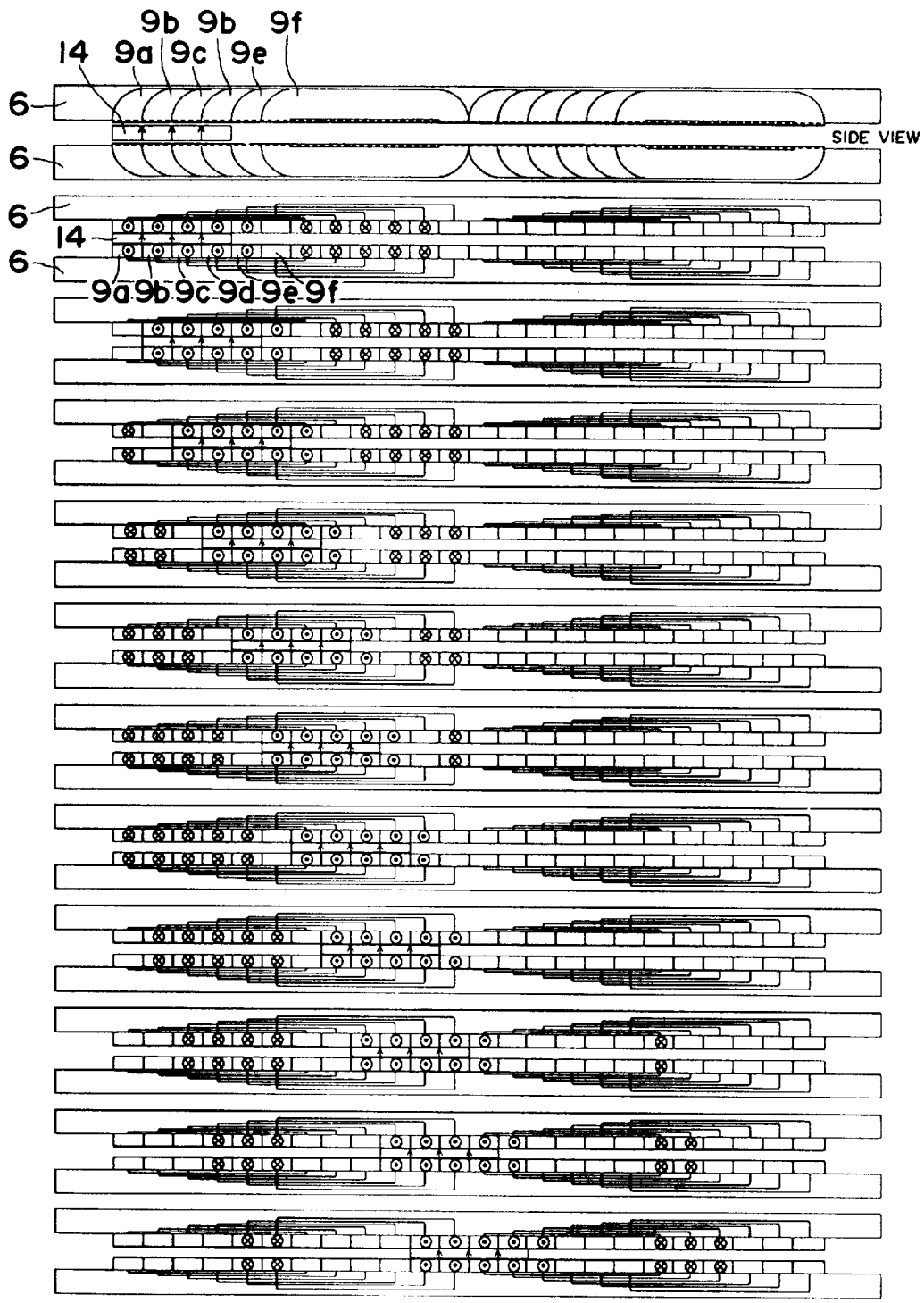
FIG. 13 is a schematic view for explaining a drive sequence in the fourth embodiment of the present invention.

A fourth embodiment of the present invention will be described. FIG. 10 is a perspective view, and FIG. 11 is a partly exploded view. FIG. 12 shows details of a fine-motion coil. FIG. 13 is a schematic view for explaining a drive sequence. Like numerals as those of the preceding embodiments described are assigned to corresponding components, and a duplicate description thereof is omitted.

In this embodiment, like the third embodiment, the structure is arranged to satisfy the relation with respect to the size in the driving direction that "(size of magnet)<(size of coil energized)", such that the whole magnet can contribute to the thrust. In addition to this, a coil wound in the same direction as the lengthwise direction of a yoke is used and, by this, saturation of the yoke due to a magnetic flux by a coil electric current is prevented. This ensures a large thrust force. Moreover, a single-pole movable magnet is used, and two types of fine-motion coils which can apply a thrust in the driving direction (Y direction) as well as in a direction (X direction) perpendicular thereto are provided. This enables fine-motion along the X-Y plane.

There are linear motors on the opposite side of the stage 2, for moving the stage 2 in the driving direction (Y direction). Like the third embodiment, the linear motor stator comprises upper and lower stator units each having saddle shaped coils 9 fixedly mounted on the yoke 6. These stator units are fixed to a base. The whole stage system includes these upper and lower stator units with their coils disposed opposed to each other, at each of the left-hand and right-hand sides of the stage, all being fixed to the base.

The movable element includes a magnet 14 held by a holding member 15-1. As compared with the third embodiment, as shown in FIG. 11, one single-pole magnet being magnetized in the vertical direction is fixed to the stage 2 through the holding member 15-1. The magnet 14 is disposed so that it can move between opposed coils of the upper and lower stator units. The size of the single-pole magnet 14 in the driving direction is four times the side dimension (FIG. 8), like the third embodiment.

As shown in FIG. 12, the yoke 6 is provided with an X fine-motion coil 12 wound in the same direction as the direction of elongation of the yoke 6, as well as a Y fine-motion coil 13 wound along the lengthwise direction of the yoke. The portion of the X fine-motion coil 12 opposed to the magnet 14 is parallel to the driving direction (Y direction). Therefore, when an electrical current is applied thereto, it can produce and apply a thrust to the movable element in a direction (X direction) perpendicular to the driving direction. With the X fine-motion coil 12 wound around the yoke 6, the yoke 6 is additionally provided with the Y fine-motion coil 13 wound along the lengthwise direction of the yoke 6. The portion of the Y fine-motion coil 13 opposed to the magnet 14 is perpendicular to the driving direction. Therefore, when an electrical current is applied thereto, it can produce and apply a thrust to the movable element in the driving direction. While the saddle shaped coil 9 can apply a thrust in the driving direction (Y direction) to the movable element, there occurs changing of coils to be energized in accordance with the position of the magnet. In the Y fine-motion coil 13, on the other hand, there is no necessity of coil changing and, therefore, high precision position control is attainable.

Furthermore, as a consequence of application of an electrical current to the X fine-motion coil 12, the resultant coil electrical current slows down the passage of coil magnetic flux through the yoke 6. Thus, magnetic saturation of the yoke 6 can be prevented and, therefore, thrust saturation can be prevented. In this respect, in designing the yoke sectional area, the yoke sectional area can be made smaller without much consideration to the magnetic saturation due to electrical current.

In this embodiment, if two magnets being magnetized oppositely with respect to the vertical direction are used in the movable magnet, as the third embodiment, in both of the X fine-motion coil and Y fine-motion coil, the thrust is canceled by the respective poles of the magnets such that, in total, no thrust is produced. However, if a reduction of magnetic saturation of the yoke is desired, such a movable magnet may be used.

In this embodiment, since the yoke 6 is provided on the stator side, the mass of the movable element of the linear motor becomes approximately a half. Further, a magnet having plural magnetic poles is provided on the movable element. As a result of this, a small magnetic path loop is formed, and both of reduction in size of the yoke and provision of a large magnetic flux density are assured. Additionally, the region in which the thrust of the linear motor with respect to the electrical current becomes linear is widened.

Furthermore, as a result of the arrangement that the yoke is provided on the stator side while the stator units are disposed opposed to each other to sandwich plural magnets of the movable element therebetween, small magnetic path loops of the magnets can be effectively used from both sides of the magnets. This is effective to produce an enlarged thrust force. Consequently, both of enlargement of thrust and reduction in weight are assured, and control response of the system is improved.

Further, as a result of the arrangement that the stator units are disposed opposed to each other and that the magnet is disposed between them, the attracting force of the magnet acting in any direction other than the moving direction of the linear motor is canceled. Thus, a stable thrust force can be produced.

Since the coils opposed to the magnets are assuredly energized, all the magnets can contribute to the thrust. Thus, the thrust per a unit movable element mass can be enlarged. As a result of this, the response to the position designation is better than that of the second embodiment.

The provision of X fine-motion coil 12 and Y fine-motion coil 13 on the yoke 6 enables fine motion along the X-Y plane. In the positioning control, in a period like an acceleration or a deceleration period where the drive electrical current is large, the saddle shaped coils 9 in which those coils opposed to the magnet 14 are selectively changed may be used, while, on the other hand, in a period like a speed control period or position control period where a small drive electric current is necessary, the Y fine-motion coil 13 in which there is no necessity of changing coils may be used. This enables high precision positioning control without unnecessary heat generation. Additionally, since the X fine-motion coil 12 is effective to prevent magnetic saturation of the yoke 6, the sectional area of the yoke 6 can be made small. This is effective to reduce the size of the stage system.

Further, like the preceding embodiments, a laminated steel plate is used for the yoke 6, and this is effective to reduce an eddy current to be produced in the yoke during relative motion between the yoke and the magnet 4. This ensures high speed and high precision positioning.

[Embodiment 5]

Figure 14:
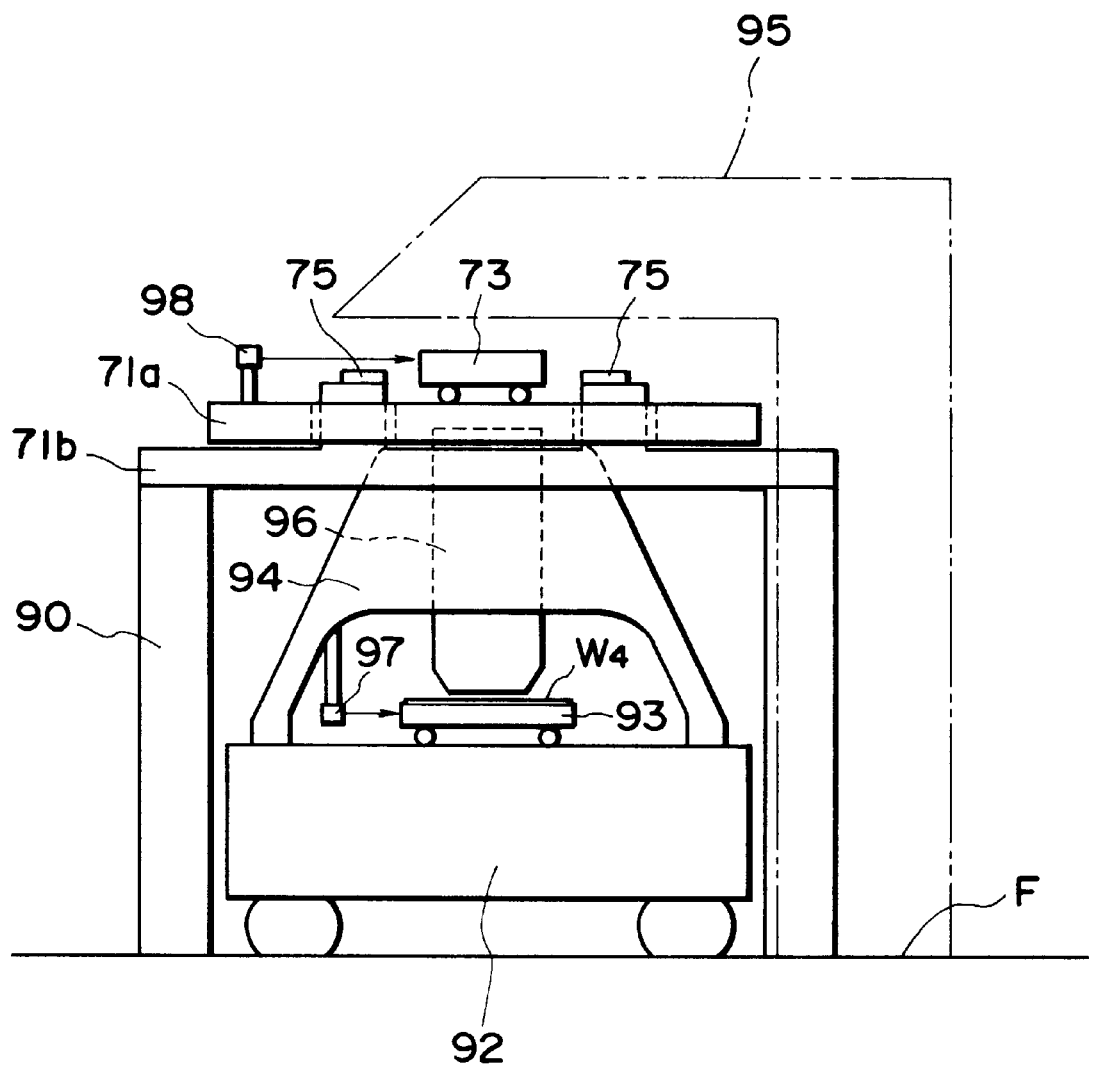
FIG. 14 is a schematic view of a general structure of a scan type exposure apparatus according to an embodiment of the present invention.

Referring now to FIG. 14, an embodiment of a scan type exposure apparatus having a stage system according to any one of the preceding embodiments, as a reticle stage, will be described.

A reticle stage base 71a for supporting a reticle stage 73 is integrally provided with a frame 94 which is mounted on a base table 92 for supporting a wafer stage 93 of the exposure apparatus. On the other hand, a linear motor base 71b is supported by a supporting frame 90, which is directly fixed to the floor F, separately from the base table 92. Exposure light with which a wafer W on the wafer stage 93 is exposed through a reticle on the reticle stage 73, is produced by a light source device 95 shown by a broken line.

The frame 94 supports the reticle stage base 71a and, additionally, it supports a projection optical system 96 between the reticle stage 73 and the wafer stage 93. A stator 75 of a linear motor for acceleration and deceleration of the reticle stage 73 is supported by the supporting frame 90 separate from the frame 94. Therefore, there is no possibility that a reactive force of the driving force of the linear motor for the reticle stage 73 is transmitted to the wafer stage 93 to cause external disturbance to its driving means or to cause vibration of the projection optical system.

The wafer stage 93 is scanningly moved in synchronism with the reticle stage 73, by the driving means. During scan of the reticle stage 73 and the wafer stage 93, the positions of them are continuously detected by means of interferometers 97 and 98, respectively. The detected positions are fed back to the driving means for the reticle stage 73 and the wafer stage 93, respectively. By this, the scan start positions of them can be accurately held in synchronism and, additionally, the scan speed in the constant-speed scan region can be controlled precisely.

[Embodiment 6]

Next, an embodiment of a semiconductor device manufacturing method using an exposure apparatus such as described above, will be described.

Figure 15:
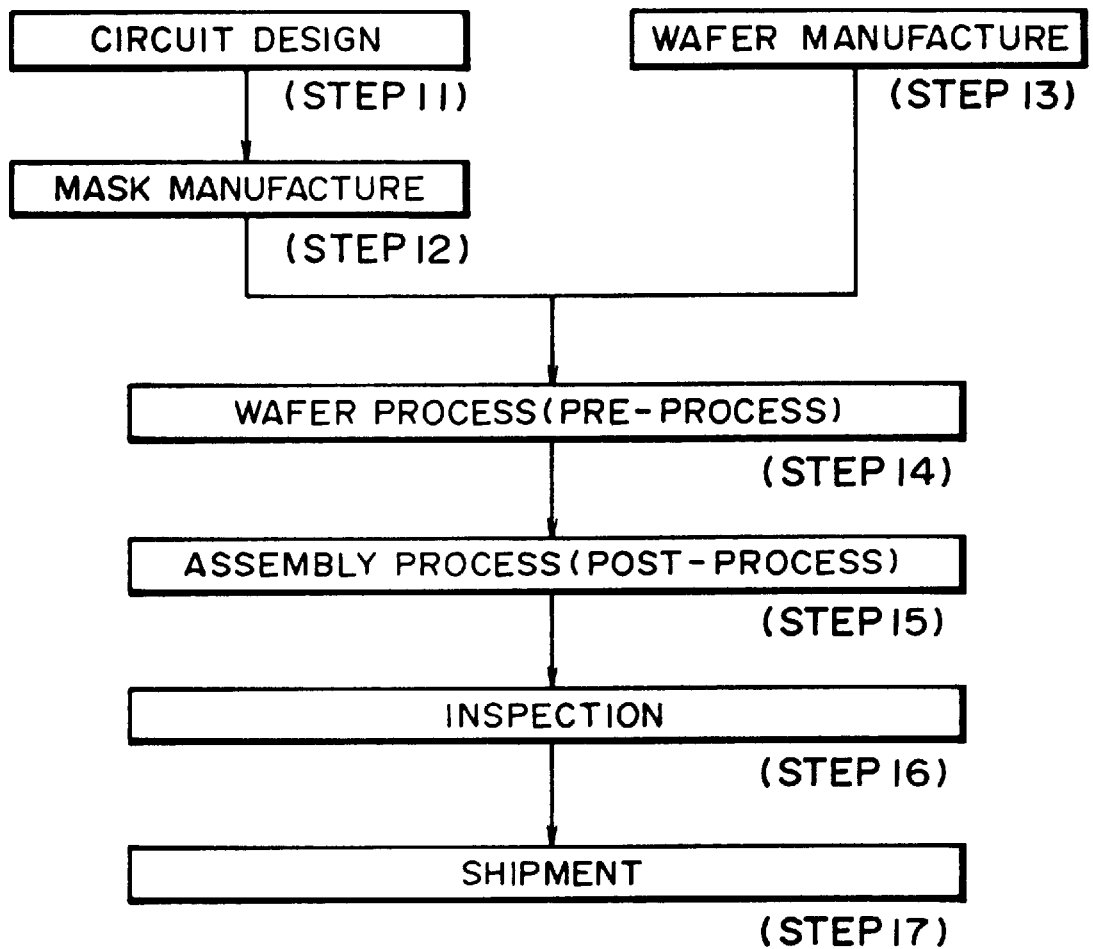
FIG. 15 is a flow chart of a semiconductor device manufacturing procedure.

FIG. 15 is a flow chart of a procedure for the manufacture of microdevices such as semiconductor chips (e.g., ICs or LSIs), liquid crystal panels, CCDS, thin film magnetic heads or micro-machines, for example. Step S11 is a design process for designing a circuit of a semiconductor device. Step S12 is a process for making a mask on the basis of the circuit pattern design. Step S13 is a process for preparing a wafer by using a material such as silicon. Step S14 is a wafer process which is called a pre-process wherein, by using the so prepared mask and wafer, circuits are practically formed on the wafer through lithography. Step SIS subsequent to this is an assembling step which is called a post-process wherein the wafer having been processed by step S14 is formed into semiconductor chips. This step includes an assembling (dicing and bonding) process and a packaging (chip sealing) process. Step S16 is an inspection step wherein an operation check, a durability check and so on for the semiconductor devices provided by step S15, are carried out. With these processes, semiconductor devices are completed and they are shipped (step S17).

Figure 16:
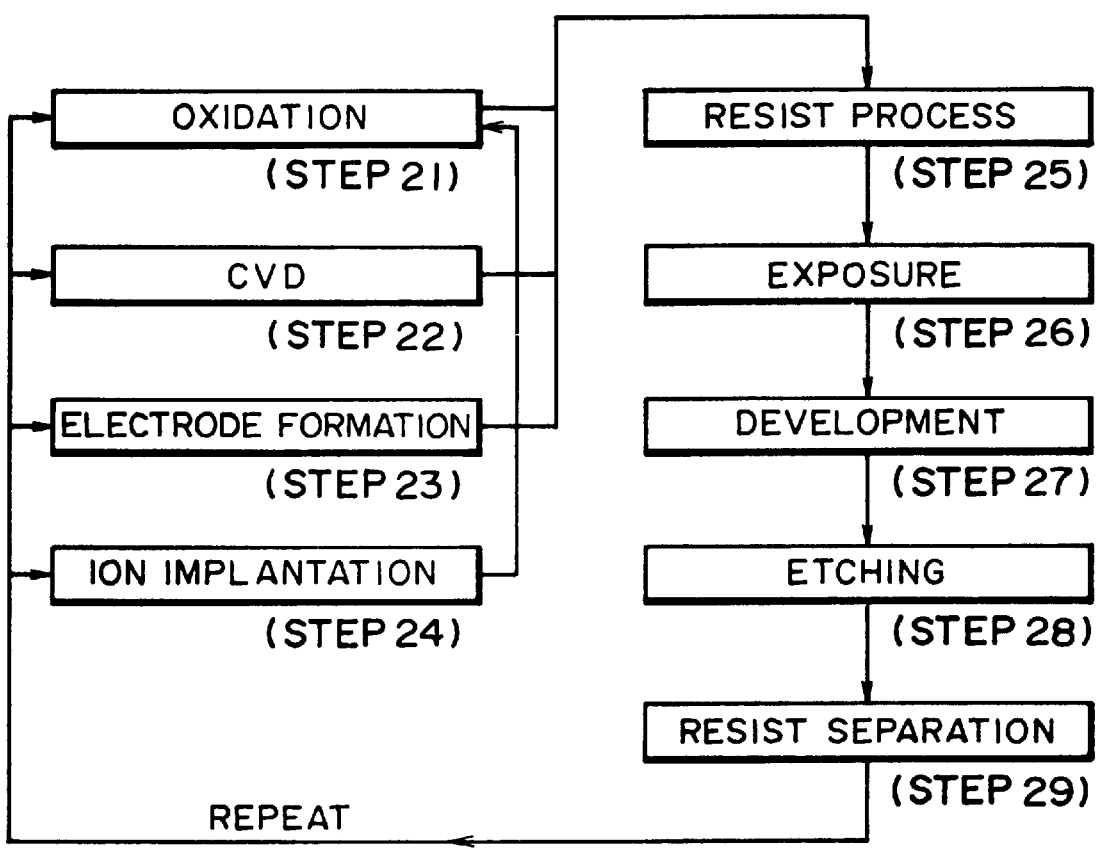
FIG. 16 is a flow chart of a wafer process.

FIG. 16 is a flow chart showing details of the wafer process. Step S21 is an oxidation process for oxidizing the surface of a wafer. Step S22 is a CVD process for forming an insulating film on the wafer surface. Step S23 is an electrode forming process for forming electrodes upon the wafer by vapor deposition. Step S24 is an ion implanting process for implanting ions to the wafer. Step S25 is a resist process for applying a resist (photosensitive material) to the wafer. Step S26 is an exposure process for printing, by exposure, the circuit pattern of the mask on the wafer through the exposure apparatus described above. Step S27 is a developing process for developing the exposed wafer. Step S28 is an etching process for removing portions other than the developed resist image. Step S29 is a resist separation process for separating the resist material remaining on the wafer after being subjected to the etching process. By repeating these processes, circuit patterns are superposedly formed on the wafer.

With these processes, high density microdevices can be manufactured.

In the linear motor mechanism according to the embodiments of the present invention described hereinbefore, a yoke is provided on the stator element side while no yoke is provided on the movable element side. This effectively reduces the mass of the movable element which is a moving component.

Further, a magnet having plural magnetic poles is provided on the movable element. As a result of this, a small magnetic path loop is formed and, consequently, the region in which the thrust of the linear motor with respect to the electrical current becomes linear is widened.

Moreover, as a result of the arrangement that a yoke is provided on the stator side while stator units are disposed opposed to each other to sandwich plural magnets of a movable element therebetween, small magnetic path loops of the magnets can be effectively used from both sides of the magnets. This is effective to produce an enlarged thrust force. Consequently, both of enlargement of thrust and reduction in weight are assured, and control response of the system is improved.

Further, as a result of the arrangement that stator units are disposed opposed to each other and that a magnet is disposed between them, the attracting force of the magnet acting in any direction other than the moving direction of the linear motor is canceled. Thus, a stable thrust force can be produced.

In an arrangement wherein coils are disposed in partial superposition with a mutual phase shift, the quantity of electrical current contributable to the thrust with respect to a movable magnet can be enlarged. When saddle-shaped coils are used, since those coils opposed to the magnetic forces are all energized, all the magnetic forces can contribute to the thrust. As a result, the thrust per movable mass increases.

A yoke may be provided with first and second coils which are different in winding direction. On that occasion, when the movable magnet comprises a single pole, fine motion along the X-Y plane can be accomplished. When the movable magnet comprises multiple poles, the first coil wound along the lengthwise direction of the yoke effectively prevents saturation of the yoke due to the magnetic flux by the coil electrical current. Thus, reduction in size of the yoke is assured without thrust saturation. This enables reduction in size of the stage mechanism, reduction of heat generation, and improvement of natural frequency of the moving component.

The linear motor mechanism may be used as a drive source of a stage system in an exposure apparatus, with advantageous results of reduction in size or weight of the whole apparatus, reduction of vibration of the stage system during an acceleration or a deceleration period, and improvement of throughput. Particularly, in a scan type exposure apparatus, these advantageous effects are quite notable. When devices are produced by use of such an exposure apparatus, production of higher precision devices is assured.

While the invention has been described with reference to the structures disclosed herein, it is not confined to the details set forth and this application is intended to cover such modifications or changes as may come within the purposes of the improvements or the scope of the following claims.

What is claimed is:

1. A linear motor, comprising:
   a plurality of stator elements each having a planar yoke and coils disposed along a predetermined direction; and
   a movable element having magnet means with plural magnetic poles,
   wherein said stator elements are disposed opposed to each other with said magnet means of said movable element disposed between the opposed stator elements.

2. A linear motor according to claim 1, wherein the yoke comprises a laminated steel plate.

3. A linear motor according to claim 1, wherein each coil comprises a flat coil.

4. A linear motor according to claim 1, wherein said coils are arrayed along the predetermined direction with a mutual phase shift.

5. A linear motor according to claim 4, wherein at least two coils of said coils are disposed with overlapping and with a phase shift along the predetermined direction, to provide a coil unit, and wherein each of said stator elements includes plural such coil units disposed along a driving direction.

6. A linear motor according to claim 4, wherein at least one of said coils comprises a flat coil with a bent portion, and a portion of said flat coil opposed to said magnet is protruded or extracted as compared with another portion of said flat coil not opposed to said magnet.

7. A linear motor according to claim 1, wherein each coil comprises a saddle shaped coil.

8. A stage system which includes a linear motor as recited in claim 1, for moving a stage.

9. An exposure apparatus which includes a stage system as recited in claim 8, for performing an exposure process to an article held by said stage system.

10. An exposure apparatus according to claim 9, wherein said exposure apparatus comprises a scan type exposure apparatus, and said stage system is adapted to hold a reticle.

11. A device manufacturing method, comprising the steps of:
    providing an exposure apparatus as recited in claim 9; and
    transferring a pattern of an original onto a substrate by using the exposure apparatus.

12. A device manufacturing method according to claim 11, further comprising applying a photosensitive material to the substrate, and developing an exposed portion of the substrate.

13. A linear motor, comprising:
    a stator element having a planar yoke and plural coils disposed along a predetermined direction; and
    a movable element having a magnet with plural magnetic poles but having no yokes.

14. A linear motor according to claim 13, further comprising a plurality of said stator elements, wherein said stator elements are disposed opposed to each other with the magnet of said movable element positioned between the opposed stator elements.

15. A linear motor according to claim 13, wherein said yoke comprises a laminated steel plate.

16. A linear motor according to claim 13, wherein each coil comprises a flat coil.

17. A linear motor according to claim 13, wherein said coils are arrayed along the predetermined direction with a mutual phase shift.

18. A linear motor according to claim 17, wherein at least two coils of said coils are disposed with overlapping and with a phase shift along the predetermined direction, to provide a coil unit, and each of said stator elements includes plural such coil units disposed along a driving direction.

19. A linear motor according to claim 18, wherein at least one of said coils comprises a flat coil with a bent portion, and a portion of said flat coil opposed to said magnet is protruded or extracted as compared with another portion of said flat coil not opposed to said magnet.

20. A linear motor according to claim 13, wherein each coil comprises a saddle shaped coil.

21. A stage system which includes a linear motor as recited in claim 13, for moving a stage.

22. An exposure apparatus which includes a stage system as recited in claim 21, for performing an exposure process to an article held by said stage system.

23. An exposure apparatus according to claim 22, wherein said exposure apparatus comprises a scan type exposure apparatus, and said stage system is adapted to hold a reticle.

24. A device manufacturing method, comprising the steps of:

providing an exposure apparatus as recited in claim 22; and transferring a pattern of an original onto a substrate by using the exposure apparatus.

25. A device manufacturing method according to claim 24, further comprising applying a photosensitive material to the substrate, and developing an exposed portion of the substrate.

26. A linear motor, comprising:

a stator element having a yoke, a first coil wound on said yoke along a first direction, and a second coil wound on said yoke along a second direction different from the first direction; and a movable element having a magnet but having no yoke.

27. A linear motor according to claim 26, wherein said yoke has a shape being elongated in one direction, the first direction corresponds to the lengthwise direction of said yoke, and the second direction is perpendicular to the lengthwise direction of said yoke.

28. A linear motor according to claim 26, further comprising a plurality of said stator elements, wherein said stator elements are disposed opposed to each other with the magnet of said movable element positioned between the opposed stator elements.

29. A linear motor according to claim 26, wherein said yoke comprises a laminated steel plate.

30. A linear motor according to claim 26, wherein said stator element further includes third coils separate from said first and second coils.

31. A linear motor according to claim 30, wherein said third coils are disposed with overlapping and with a phase shift along said first direction.

32. A stage system which includes a linear motor as recited in claim 26, for moving a stage.

33. An exposure apparatus which includes a stage system as recited in claim 32, for performing an exposure process to an article held by said stage system.

34. An exposure apparatus according to claim 33, wherein said exposure apparatus comprises a scan type exposure apparatus, and said stage system is adapted to hold a reticle.

35. A device manufacturing method, comprising the steps of:

providing an exposure apparatus as recited in claim 33; and transferring a pattern of an original onto a substrate by using the exposure apparatus.

36. A device manufacturing method according to claim 35, further comprising applying a photosensitive material to the substrate, and developing an exposed portion of the substrate.

* * * * *

UNITED STATES PATENT AND TRADEMARK OFFICE
CERTIFICATE OF CORRECTION

PATENT NO. : 6,107,703
DATED : August 22, 2000
INVENTOR(S) : NOBUSHIGE KORENAGA

It is certified that error appears in the above-identified patent and that said Letters Patent is hereby corrected as shown below:

COLUMN 6:
   Line 47, "fixed Lo" should read --fixed to--.

COLUMN 10:
   Line 23, "CCDS," should read --CCDs,--.
   Line 31, "SIS" should read --S15--.

Signed and Sealed this

Twenty-ninth Day of May, 2001

Attest:

NICHOLAS P. GODICI

Attesting Officer        Acting Director of the United States Patent and Trademark Office